US012757317B2

(12) United States Patent
Gunnam et al.

(10) Patent No.: US 12,757,317 B2
(45) Date of Patent: Oct. 6, 2026

(54) TECHNOLOGIES FOR REDUCING THE IMPACT OF RADIOFREQUENCY INTERFERENCE ON A CIRCUIT BOARD

(71) Applicant: Intel Corporation, Santa Clara, CA (US)

(72) Inventors: Venkata Mahesh Gunnam, Andhra Pradesh (IN); Rakesh Yedri, Bangalore (IN); Phani Alaparthi, Bangalore (IN); David Elayaraj Samaraj, Natrampalli (IN); Jackson C.P. Kong, Tanjung Tokong (MY); Bala Subramanya, Bangalore (IN); Navneet Kumar Singh, Bangalore (IN); Yagnesh V. Waghela, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 212 days.

(21) Appl. No.: 18/513,045

(22) Filed: Nov. 17, 2023

(65) Prior Publication Data

US 2025/0113430 A1 Apr. 3, 2025

(30) Foreign Application Priority Data

Sep. 28, 2023 (IN) ............................. 202341065284

(51) Int. Cl.
*H05K 1/02* (2006.01)
*H05K 3/12* (2006.01)
*H05K 3/3452* (2026.01)

(52) U.S. Cl.
CPC ......... *H05K 1/0219* (2013.01); *H05K 3/1216* (2013.01); *H05K 3/3452* (2013.01)

(58) Field of Classification Search
CPC ........................... H05K 1/0219; H05K 3/3425
See application file for complete search history.

(56) References Cited

U.S. PATENT DOCUMENTS

2018/0146543 A1* 5/2018 Chen .................... H05K 1/0219
2022/0015246 A1 1/2022 Balakrishnan et al.
2022/0223330 A1 7/2022 Wang et al.
2024/0145372 A1* 5/2024 Tsao .................... H01L 23/3185

* cited by examiner

*Primary Examiner* — Jeremy C Norris
(74) *Attorney, Agent, or Firm* — Alliance IP, LLC

(57) ABSTRACT

Technologies for reducing the impact of inductors on electrical traces are disclosed. In an illustrative embodiment, conductive ink is applied in a silk screen layer on top of a solder mask of a circuit board. The conductive ink forms shield regions under and near where inductors are placed and/or where a power plane is routed. The conductive shield regions may be coupled to a ground plane in the circuit board. The conductive shield regions can partially shield traces under and near the inductor, reducing the noise induced on nearby traces. The conductive shield regions can allow traces for high-speed input/output signals to be routed closer to the inductor, reducing the size, number of layers, and/or cost of the circuit board. In some embodiments, the conductive shield regions can shield emissions from the power plane, reducing interference on antennas of a device.

20 Claims, 13 Drawing Sheets

TECHNOLOGIES FOR REDUCING THE IMPACT OF RADIOFREQUENCY INTERFERENCE ON A CIRCUIT BOARD

CROSS-REFERENCE TO RELATED APPLICATIONS

This application claims the benefit under 35 U.S.C. § 119(a) of Indian Patent Application number 202341065284, filed on Sep. 28, 2023, and entitled, "TECHNOLOGIES FOR REDUCING THE IMPACT OF RADIOFREQUENCY INTERFERENCE ON A CIRCUIT BOARD."

BACKGROUND

Circuit boards are ubiquitous in modern electronics. Circuit boards can connect various components, such as voltage regulators and integrated circuit components. Circuit boards can have a large number of connections in multiple layers connecting different components. In some cases, a circuit board can have a high-speed signal trace and a component such as a voltage regulator. In order to prevent or mitigate noise from the voltage regulator, the high-speed signal trace may be routed far away from the voltage regulator. In some cases, a circuit board can have exposed power planes that can cause radiofrequency interference. To prevent or mitigate interference from power planes, circuit board layers and or/shielding component may be required.

DETAILED DESCRIPTION

Figure 1:
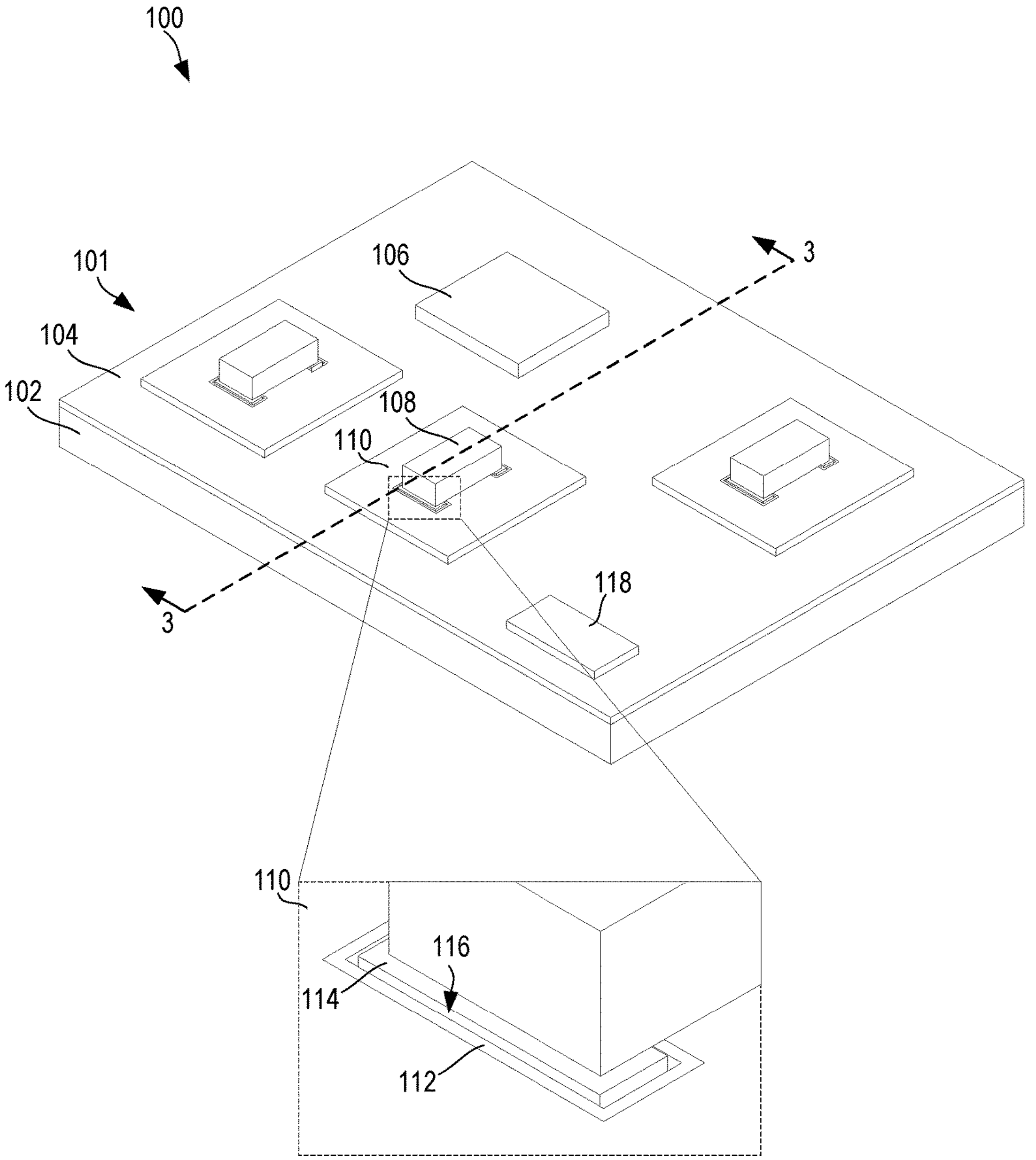
FIG. 1 is an isometric view of a system with a substrate and several inductors mounted on the substrate.

In various embodiments disclosed herein, a substrate may support one or more inductors and one or more integrated circuit components. The substrate may have a solder mask layer and a silk screen layer, with the silk screen layer including one or more conductive shield regions. The conductive shield regions may be made out of conductive ink. The conductive shield regions may be below and/or around the inductors. The conductive shield regions can partially shield traces in the substrate from noise induced by the inductors, reducing noise on the traces. In some embodiments, the conductive shield regions may be above and/or near surface power planes, reducing radiofrequency interference (RFI) from the power planes.

As used herein, the phrase "communicatively coupled" refers to the ability of a component to send a signal to or receive a signal from another component. The signal can be any type of signal, such as an input signal, an output signal, or a power signal. A component can send or receive a signal to another component to which it is communicatively coupled via a wired or wireless communication medium (e.g., conductive traces, conductive contacts, air). Examples of components that are communicatively coupled include integrated circuit dies located in the same package that communicate via an embedded bridge in a package substrate and an integrated circuit component attached to a printed circuit board that send signals to or receives signals from other integrated circuit components or electronic devices attached to the printed circuit board.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact, and "coupled" may indicate elements co-operate or interact, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term. For example, the central axis of a magnetic plug that is substantially coaxially aligned with a through hole may be misaligned from a central axis of the through hole by several degrees. In another example, a substrate assembly feature, such as a through width, that is described as having substantially a listed dimension can vary within a few percent of the listed dimension.

It will be understood that in the examples shown and described further below, the figures may not be drawn to scale and may not include all possible layers and/or circuit components. In addition, it will be understood that although certain figures illustrate transistor designs with source/drain regions, electrodes, etc. having orthogonal (e.g., perpendicular) boundaries, embodiments herein may implement such boundaries in a substantially orthogonal manner (e.g., within +/−5 or 10 degrees of orthogonality) due to fabrication methods used to create such devices or for other reasons.

Reference is now made to the drawings, which are not necessarily drawn to scale, wherein similar or same numbers may be used to designate the same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives within the scope of the claims.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

Figure 2:
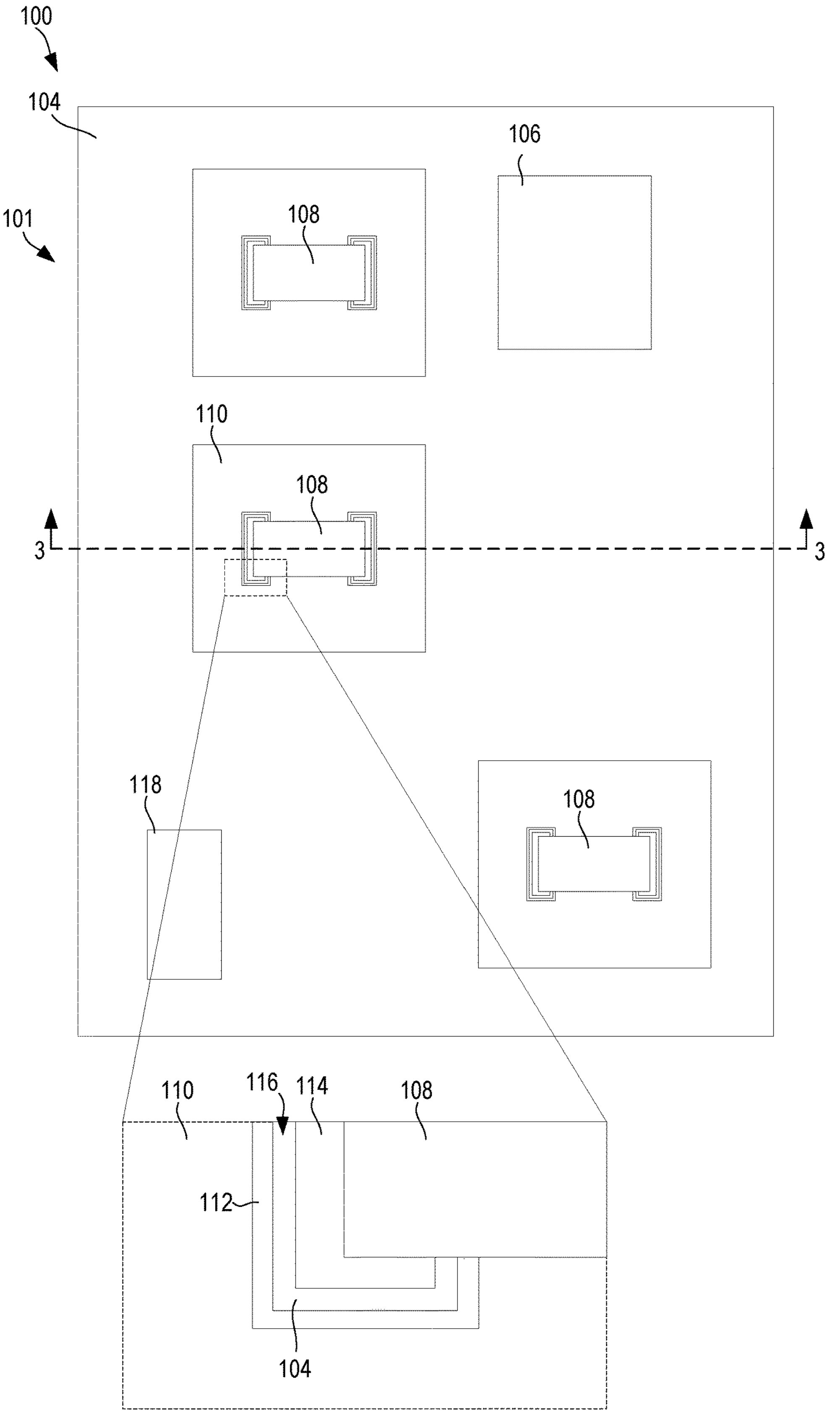
FIG. 2 is a top-down view of the system of FIG. 1.
Figure 3:
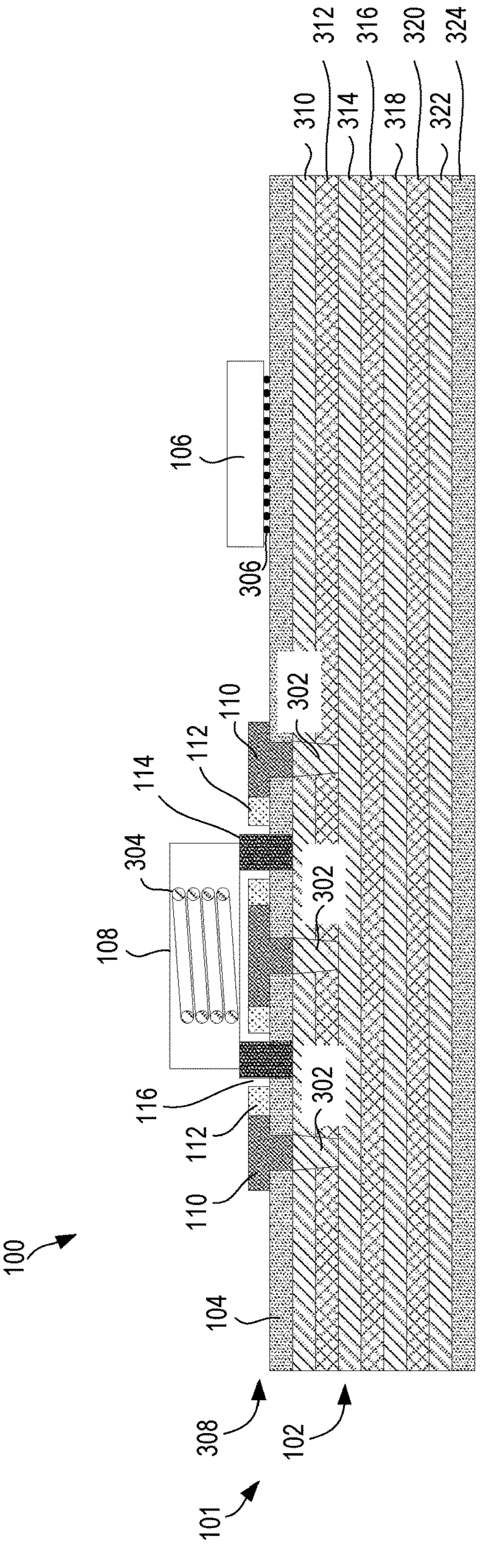
FIG. 3 is a cross-sectional view of the substrate of FIG. 1.

Referring now to FIGS. 1-3, in one embodiment, a system 100 includes a circuit board 101 on which one or more integrated circuit components 106 and one or more inductors 108 are mounted. FIG. 1 shows an isometric view of the system 100, FIG. 2 shows a top-down view of the system, and FIG. 3 shows a cross-sectional view of the system 100. A solder mask 104 is disposed on a substrate 102 of the circuit board 101, with a bottom surface of the solder mask 104 adjacent a top surface of the substrate 102. One or more conductive shield regions 110 are disposed on a top surface of the solder mask 104, in a silk screen layer 308 of the circuit board 101. The conductive shield regions 110 are below and/or around the inductor 108.

It should be appreciated that, as used herein, the "top side," "bottom side," etc., is an arbitrary designation used for clarity and does not denote a particular required orientation for manufacture or use. Although the illustrative embodiment described has the inductor 108, solder mask 104, conductive shield regions 110, etc., placed on the "top" side of the circuit board 101, in some embodiments, those components may additionally or alternatively be placed on the "bottom" side of the circuit board 101.

In use, the inductors 108 may form part of a voltage regulator. Current through the inductors 108 may change at a relatively high rate of, e.g., 500 kilohertz to 2 megahertz. The current amount may be high, such as up to 30-50 amps per inductor 108. As current through the inductors 108 changes, noise is generated in nearby traces, such as traces in trace layers 310, 314, 318, 322. In some cases, without the conductive shield regions 110, the noise generated in nearby traces may be as high as, e.g., 180 mV. The noise can lead to signal integrity issues, possibly resulting in system failure.

Possible approaches for mitigating the risk of noise coupling includes increasing the distance from the inductor 108 and/or increasing the metal thickness of traces. Such a limitation may lead to reducing area for routing high-speed input/output traces, increasing circuit board size, increasing circuit board layer count, etc.

The conductive shield regions 110 can reduce the noise caused by the inductors 108 on nearby traces. The magnetic fields from the inductors 108 induce eddy currents in the conductive shield regions 110, absorbing some of the electromagnetic noise emitted from the inductors 108. The conductive shield regions 110 thereby reduce the noise generated in nearby traces.

In an illustrative embodiment, the substrate 102 of the circuit board 101 includes trace layers 310, 314, 318, 322. The trace layers 310, 314, 318, 322 are separated by dielectric layers 312, 316, 320, 324. The dielectric layers 312, 316, 320, 324 may be referred to as core or prepreg layers, as appropriate. A solder mask 324 may be on the bottom surface of the substrate 102. The circuit board 101 may include any suitable number of traces layers separated by dielectric layers, such as 1-10. Each of the illustrative dielectric layers 312, 316, 320, 324 is a fiberglass board made of glass fibers and a resin, such as FR-4. In other embodiments, any suitable dielectric layers may be used. The thickness of each trace layer 310, 314, 318, 322 and/or dielectric layer 312, 316, 320, 324 can be any suitable thickness, such as 15 to 500 micrometers. The total thickness of the circuit board 101 may be any suitable thickness, such as 100 micrometers to 5 millimeters. The circuit board 101 can have any suitable length and width, such as 5-500 millimeters. Although shown as a rectangle, it should be appreciated that the circuit board 101 may be any suitable shape and may have protrusions, cutouts, etc., in order to accommodate, fit, or touch other components of a device. In the illustrative embodiment, the circuit board 101 and each layer 310, 312, 314, 316, 318, 320, 322 are planar. In other embodiments, some or all of the circuit board 101 and layers 310, 312, 314, 316, 318, 320, 322 may be non-planar.

The trace layers 310, 314, 318, 322 may include one or more traces made of copper or other conductor. The traces may carry power signals, carry high-speed input/output, establish ground planes, etc. Traces for power signals may be able to carry large amounts of current as an input to and an output from the inductors 108, such as 1-100 amps. As such, some of the traces for power signals may have a relatively large area and/or thickness compared to other traces on the circuit board 101. For example, traces for power signals may have a width of, e.g., 1-20 millimeters. Each trace on the circuit board may have any suitable width, such as any width from 0.05-20 millimeters. In the illustrative embodiment, signal traces may have a width of 0.1-0.15 millimeters. Each trace on the circuit board may have any suitable height, such as any height from 5 micrometers to 40 micrometers. Vias may extend between trace layers 310, 314, 318, 322 through dielectric layers 312, 316, 320, 324 to connect traces on different trace layers 310, 314, 318, 322.

In an illustrative embodiment, some of the traces may be embodied as a differential stripline that can carry high-speed signals. In other embodiments, there may be one high-speed signal trace that carries a signal, and there may be a ground plane or other ground traces near the signal trace. As used herein, a high-speed signal trace refers to a trace that connects two or more circuit components that will transmit and/or receive a signal on the high-speed signal trace at an analog frequency of 100 megahertz or higher. High-speed signal traces may be used for any suitable signal, such as a peripheral component interconnect express (PCIe) interconnect (e.g., a PCIe 6 interconnect), a memory interconnect (such as a DDR or GDDR memory interconnect), a compute express link (CXL) interconnect, a USB interconnect, a display interconnect, etc. In some embodiments, at least part of the high-speed signal traces may be directly below the inductor 108 and not displaced to one side or the other. In other embodiments, some or all of a high-speed signal trace may be laterally displaced from directly below the inductor 108, such as 1-8 laterally displaced millimeters. In some embodiments, the lateral displacement for high-speed signal traces relative to the inductor 108 may be referred to as a keep-out zone (KOZ) of the inductor 108. It should be appreciated that the shielding of the conductive shield regions 110 may allow the signal traces to be closer to the inductor 108 than they might otherwise be able to be (i.e., the keep-out zone may be smaller). As a result, the circuit board 101 may have a smaller form factor than it otherwise would without the conductive shield regions 110. Additionally or alternatively, the circuit board 101 may have fewer layers than it otherwise would without the conductive shield regions 110, as more of the circuit board 101 may be available to use to route high-speed signal traces.

The circuit board 101 may include several other traces or connections not shown in the figures, such as connections between various integrated circuit components such as a processor circuit, a memory circuit, a display circuit, power components, circuit components, etc. In some embodiments, the circuit board 101 may interface with or form a part of, e.g., the processor 1402, system memory 1404, etc., described below in regard to FIG. 14.

The solder mask 104 acts as a protective barrier to help prevent solder bridges from forming between closely spaced solder pads during the soldering process and to help protect against environmental factors, corrosion, and physical damage. The solder mask 104 may be made of any suitable material, such as epoxy resin, a photo-sensitive material, fillers, and/or the like. The solder mask 104 may cover some or all of the top surface of the substrate 102, except for places where an electrical connection is made through to the substrate 102. In an illustrative embodiment, the solder mask 104 has a thickness of about 15 micrometers. In other embodiments, the solder mask 104 may have any suitable thickness, such as 5-100 micrometers.

The one or more integrated circuit component 106 may be any suitable component or combination of components, such as a processor die, a memory die, a central processing unit (CPU), a graphics processing unit (CPU), any other suitable processing unit (xPU), accelerator circuit, a field-programmable gate array (FPGA), an application-specific integrated circuit (ASIC), etc. The one or more integrated circuit components 106 may be connected to contact pads on the substrate 102 through solder balls 306.

In the illustrative embodiment, the inductor 108 forms part of a voltage regulator. The inductor 108 may or may not have a magnetic core. The inductor 108 may include one or more coils 304 of wire. The inductor 108 generates a magnetic field that extends at least partially into the circuit board 101. In the illustrative embodiment, the inductor 108 is part of a switch-mode voltage regulator that uses one or more power delivery inductors 108. Additionally or alternatively, in some embodiments, the voltage regulator may include other components that may cause electrical or magnetic noise. In other embodiments, a circuit component 108 that causes electrical or magnetic noise may be a component other than an inductor or voltage regulator.

The inductor 108 is connected to the substrate 102 through solder joints 114, which are connected to pads on the substrate 102. In an illustrative embodiment, the solder joints 114 may be embodied as a solder paste that is flowed into a solder contact to connect the inductor 108 to the substrate 102.

In an illustrative embodiment, the conductive shield region 110 covers an area under and around the inductor 108, other than an area around the solder joints 114 that connect the inductor 108 to the substrate 102. As shown in FIG. 1, the conductive shield region 110 may surround a solder joint 114 and the underlying pads connecting the inductor 108 to the substrate 102. Between the solder joints 114 and the conductive shield region 110, there may be a dielectric barrier 112 and/or a gap 116 to electrically isolate the conductive shield region 110 from the solder joints 114 for the inductor 108. The dielectric barrier 112 may be any suitable dielectric, such as a nonconductive ink deposited using a silk screen process as part of the silk screen layer 308.

The conductive shield region 110 may be made of any suitable conductive material. In an illustrative embodiment, the conductive shield region 110 is a conductive ink or conductive paste that is applied using a silk screen printing process. As used herein, ink can refer to either the liquid ink as it is being applied or to the solid ink after it has dried or cured. The conductive ink may be any suitable combination of materials, such as metallic particles, binders, carrier fluids, additives, etc. The conductive ink and shield region 110 may be transparent or nontransparent. Some or all of the components of the conductive ink other than the metallic particles may be removed or chemically changed as the ink dries and/or cures. The metallic particles of conductive ink may include, e.g., aluminum, copper, carbon, graphene, bronze, silver, gold, zinc, stainless steel, palladium, platinum, and/or any suitable combination thereof. The metallic particles may make up any suitable fraction of the conductive shield region 110 by weight, such as 10-90%. The binders of the conductive ink may include resins or other substances that hold the metallic particles in suspension and adhere them to the surface of the solder mask 104. The carrier fluids of the conductive ink may be solvents or other fluids used to maintain the ink's desired viscosity during the printing process. The conductive shield region 110 may have any suitable resistivity, such as a contact resistivity of less than, e.g., 0.5-5 $mW \cdot cm^2$ and/or sheet resistivity of less than, e.g., 0.5-20 milliohms per square at a thickness of 25 mm. The conductive ink may have any suitable sintering temperature, such as 140-200° C. For example, in one embodiment, the conductive ink may be DM-SIP-3076S by Dycotec Materials, with a sintering temperature of 140-200° C., contact resistance <2 $mW \cdot cm^2$, and electrical resistance of <5 mW/□/25 mm at 200° C. cure. The conductive shield region 110 may be ferromagnetic, diamagnetic, paramagnetic, or nonmagnetic. In some embodiments, the conductive shield region 110 may be applied as a solder paste, circuit paste, or similar material. In one embodiment, the conductive shield region 110 may be applied as a layer of Tatsuta® SW180T7 about 25 micrometers thick. Such a conductive shield region 110 may have a resistivity of about 6·10^-5 W·cm. Such a conductive shield region 110 may have a viscosity (before drying, curing, reflow, etc.) of any suitable value, such as 1,000-1,400 dPa·s.

The conductive shield regions 110 may have any suitable thickness, such as 5-100 micrometers. In an illustrative embodiment, the conductive shield regions 110 have a thickness of about 30 micrometers. The amount of space between the top surface of the substrate 102 and the bottom of components such as the inductors 108 and/or the integrated circuit components 106 may be any suitable amount, such as 50-300 micrometers. In an illustrative embodiment, the distance between the top surface of the substrate 102 and the bottom of components such as the inductors 108 and/or the integrated circuit components 106 is about 100 micrometers. It should be appreciated that, in the illustrative embodiment, the distance between the top surface of the substrate 102 and the bottom of components such as the inductors 108 and/or the integrated circuit components 106 is more than the thickness of the solder mask 104 and the conductive shield regions 110. As such, the addition of the conductive shield regions 110 does not interfere with the position of the inductors and/or the integrated circuit components, and the addition of the conductive shield regions 110 does not increase the overall height of the system 100.

The conductive shield regions 110 may cover any suitable area of the substrate 102 and/or the solder mask 104. In some cases, the conductive shield region 110 may have the most impact directly below the inductor 108, and the conductive shield region 110 may only be present directly below the inductor 108 and/or in an area around the inductor 108, such as within 1-10 millimeters of the inductor 108. In some embodiments, the conductive shield regions 110 may cover most or substantially all of the solder mask 104 except for places at or near where an electrical connection is made through to the substrate 102. In some embodiments, the conductive shield regions 110 may be used as an additional ground plane and/or may be used for general shielding against electromagnetic interference.

Figure 4:
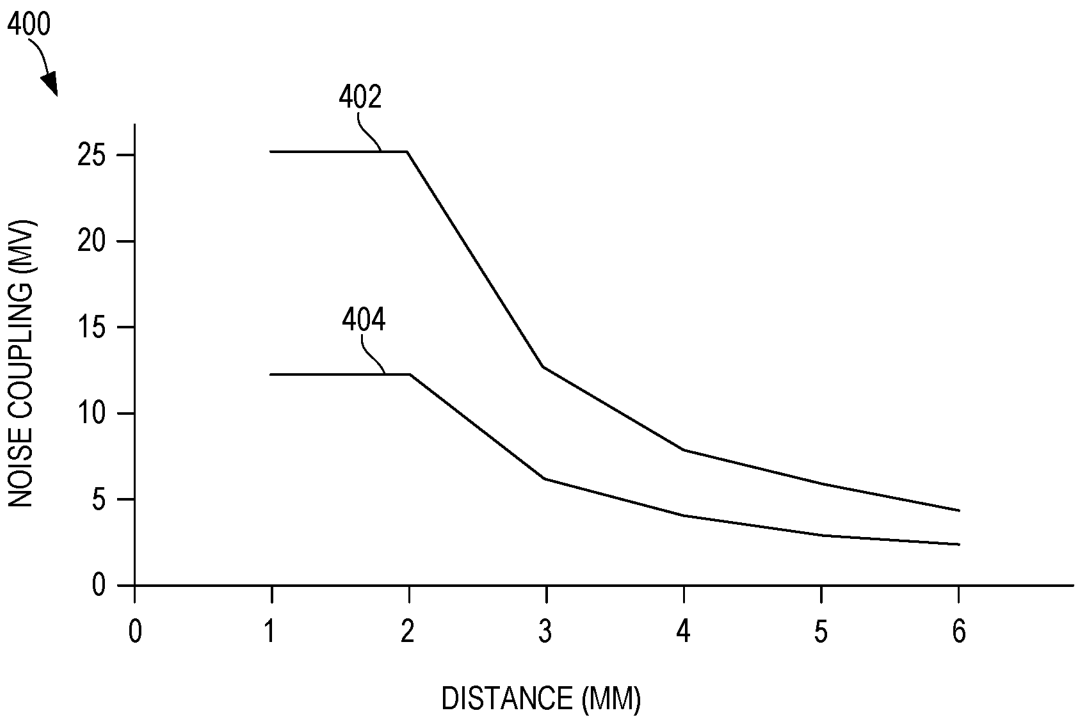
FIG. 4 is a graph showing voltage noise as a function of distance with and without a shielding layer.

In some embodiments, the conductive shield regions 110 may connect through the solder mask 104 to the substrate 102. The conductive shield regions 110 may be connected to any suitable trace, via, ground plane, etc. For example, as shown in FIG. 4, the conductive shield region 110 is connected to a via 302 to a ground plane in the trace 312. Connecting the conductive shield region 110 to a ground plane may improve the shielding ability of the conductive shield region.

In some embodiments, a legend 118 or other printing 118 may be on the solder mask 104. The legend 118 or other printing 118 may include, e.g., legend information, component labels, orientation marks, pin 1 indicators, logos and branding, text labels, etc. The legend 118 or other printing 118 may be any suitable dielectric, such as a nonconductive ink deposited using a silk screen process as part of the silk screen layer 308. As discussed in more detail below in regard to the method 600, in an illustrative embodiment, the legend 118 or other printing 118, the dielectric barrier 112, and the conductive shield regions 110 are all positioned in a silk screen layer 308 above the solder mask layer 104. In an illustrative embodiment, the legend 118 or other printing 118, the dielectric barrier 112, and/or the conductive shield regions 110 may be deposited using a silk screen printing process. In other embodiments, another process may be used, such as ink jet printing, photolithography, etc.

Figure 5:
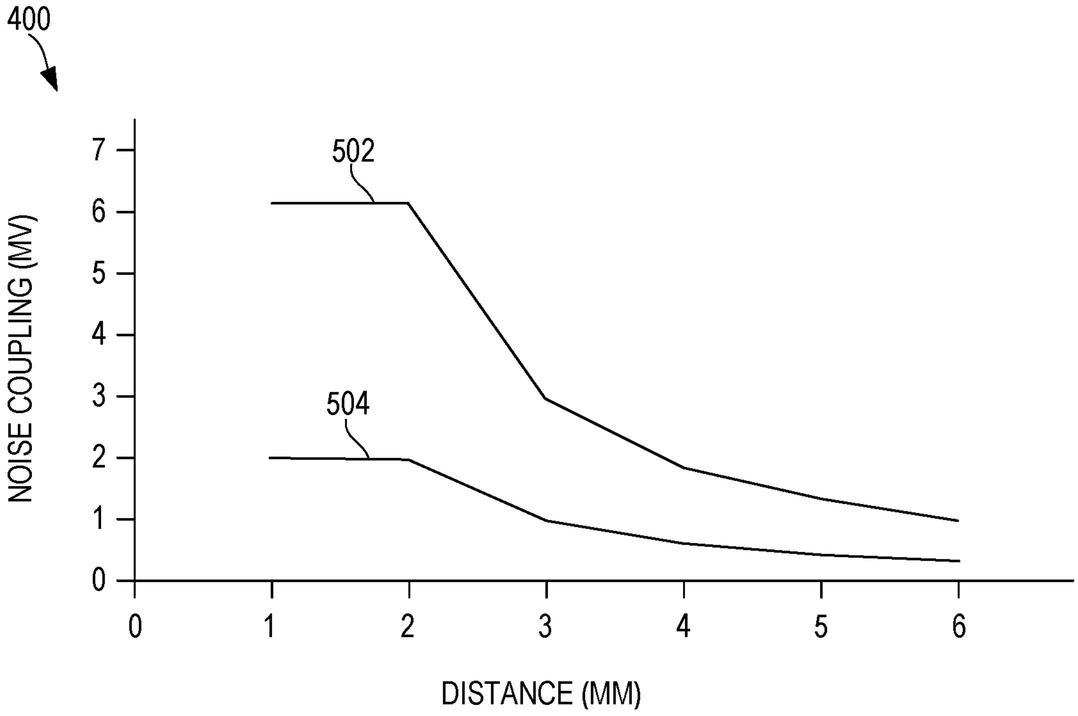
FIG. 5 is a graph showing voltage noise as a function of distance with and without a shielding layer.

Referring now to FIGS. 4 and 5, in one embodiment, graphs show simulations of the change in noise coupling with and without the conductive shield regions 110 in different circumstances. In FIG. 4, the graph 400 shows curve 402 showing the noise as a function of lateral distance from the inductor 108 (i.e., distance across the page from the top-down perspective of FIG. 2) without the conductive shield regions 110, and the curve 404 shows the noise with the conductive shield regions 110. In the simulated circuit board 101, the simulated traces are on the third layer, the thickness between trace layers 310, 314, 318, 322 is 101 micrometers, and the thickness of the traces is 25 micrometers. In some applications, a noise amount over 5 mV is considered high risk, a noise level between 2 and 5 mV is considered medium risk, and a noise level below 2 mV is considered low risk. In FIG. 5, the graph 500 shows curve 502 showing the noise as a function of lateral distance from the inductor 108 without the conductive shield regions 110, and the curve 504 shows the noise with the conductive shield regions 110. The graph 500 is a simulation of traces on the fourth layer, with a thickness between trace layers 310, 314, 318, 322 of 159 micrometers, with other parameters of the circuit board the same as for the graph 400. The values for the curves 402, 404 are shown in Table 1, and the values for the curves 502, 504 are shown in Table 2. As can be seen from the graphs and tables, adding the conductive shield regions 110 can significantly reduce the noise level. In general, adding the conductive shield regions 110 may reduce induced voltage noise by, e.g., 20-70%.

TABLE 1

| Lateral distance from inductor 108 (mm) | Noise coupling without shield regions 110 (mV) | Noise coupling with shield regions 110 (mV) | Relative noise level (%) |
|---|---|---|---|
| 0 | 25.2 | 12.29 | 48.77 |
| 1 | 25.2 | 12.29 | 48.77 |
| 2 | 12.75 | 6.21 | 48.71 |
| 3 | 8.23 | 4.01 | 48.72 |
| 4 | 6.14 | 2.99 | 48.69 |
| 5 | 4.78 | 2.33 | 48.74 |

TABLE 2

| Lateral distance from inductor 108 (mm) | Noise coupling without shield regions 110 (mV) | Noise coupling with shield regions 110 (mV) | Relative noise level (%) |
|---|---|---|---|
| 0 | 6.16 | 1.99 | 32.31 |
| 1 | 6.15 | 1.98 | 32.20 |
| 2 | 2.99 | 0.96 | 32.11 |
| 3 | 1.85 | 0.59 | 31.89 |
| 4 | 1.32 | 0.42 | 31.82 |
| 5 | 0.99 | 0.32 | 32.32 |

Figure 6:
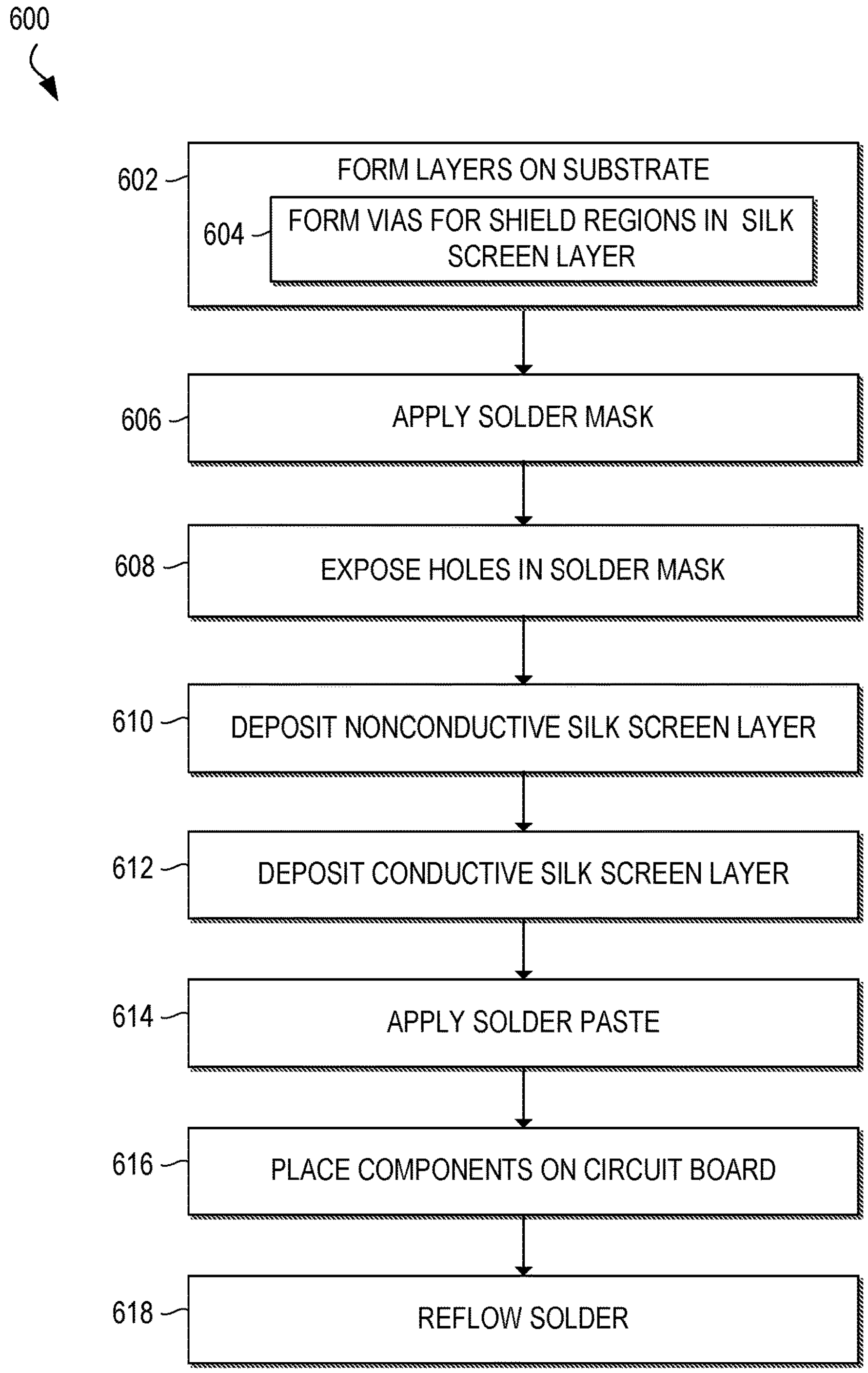
FIG. 6 is a flowchart of one embodiment of a method of creating the system of FIG. 1.

Referring now to FIG. 6, in one embodiment, a flowchart for a method 600 for creating the system 100 is shown. The method 600 may be executed by a technician and/or by one or more automated machines. In some embodiments, one or more machines may be programmed to do some or all of the steps of the method 600. Such a machine may include, e.g., a memory, a processor, data storage, etc. The memory and/or data storage may store instructions that, when executed by the machine, causes the machine to perform some or all of the steps of the method 600. The method 600 may use any suitable set of techniques that are used in semiconductor processing or circuit board processing, such as chemical vapor deposition, atomic layer deposition, physical layer deposition, molecular beam epitaxy, layer transfer, photolithography, ion implantation, dry etching, wet etching, selective laser etching, thermal treatments, flip chip, layer transfer, magnetron sputter deposition, pulsed laser deposition, laser machining, 3D photolithography, screen printing, ink jet printing, ink spraying, etc. It should be appreciated that the method 600 is merely one embodiment of a method to create one embodiment of a system and other methods may be used to create any suitable embodiment of the system. In some embodiments, steps of the method 600 may be performed in a different order than that shown in the flowchart.

Figure 7:
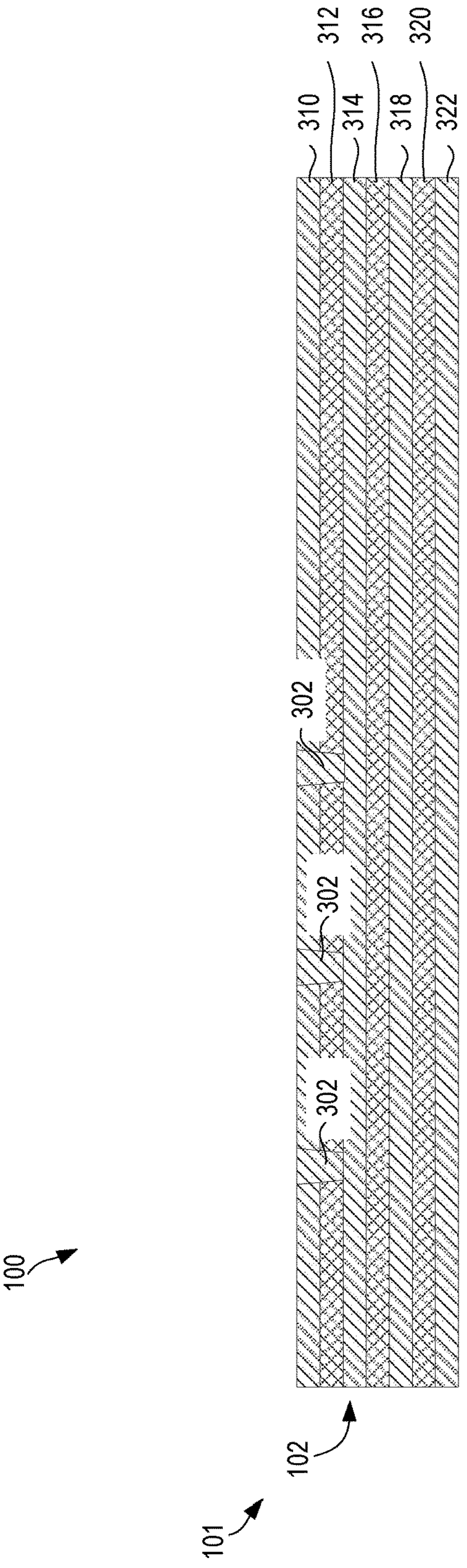
FIG. 7 is a cross-sectional view of one embodiment of a system at one stage of the flowchart of FIG. 6.

The method 600 begins in block 602, in which one or more layers 310, 312, 314, 316, 318, 320, 322 are formed on the substrate 102, as shown in FIG. 7. The layers 310, 312, 314, 316, 318, 320, 322 may be built up by applying traces and prepreg layers on a core layer. In block 604, vias 302 for connecting the conductive shield regions 110 of the silk screen layer 308 to a trace layer, such as a ground plane in the trace layer 314.

Figure 8:
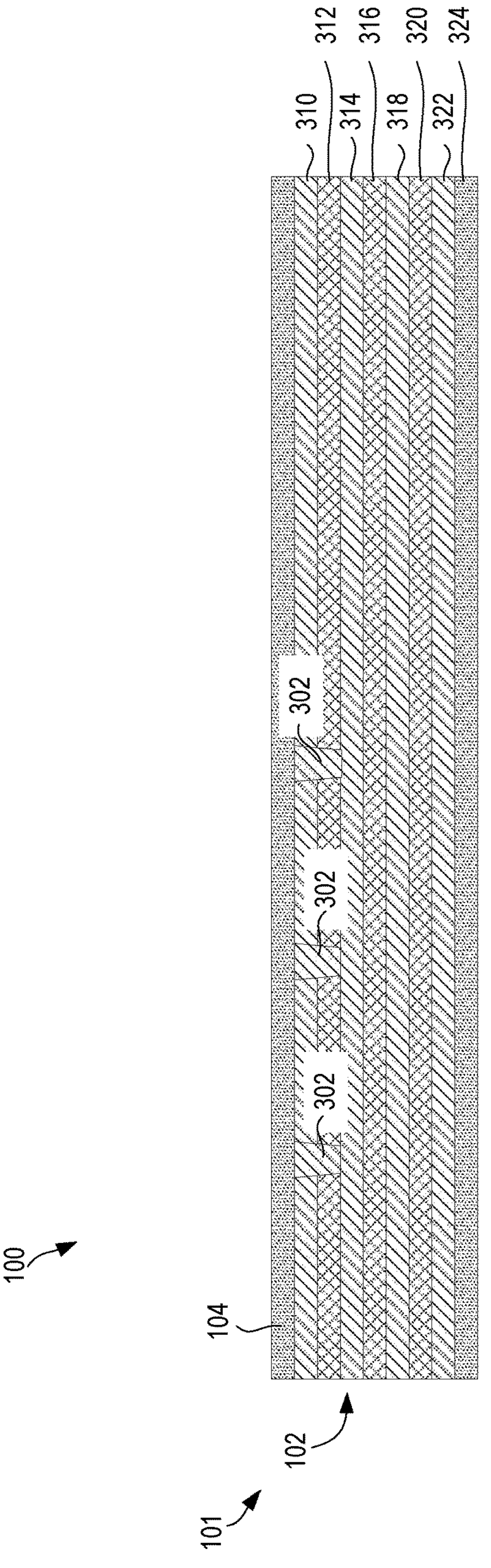
FIG. 8 is a cross-sectional view of one embodiment of a system at one stage of the flowchart of FIG. 6.
Figure 9:
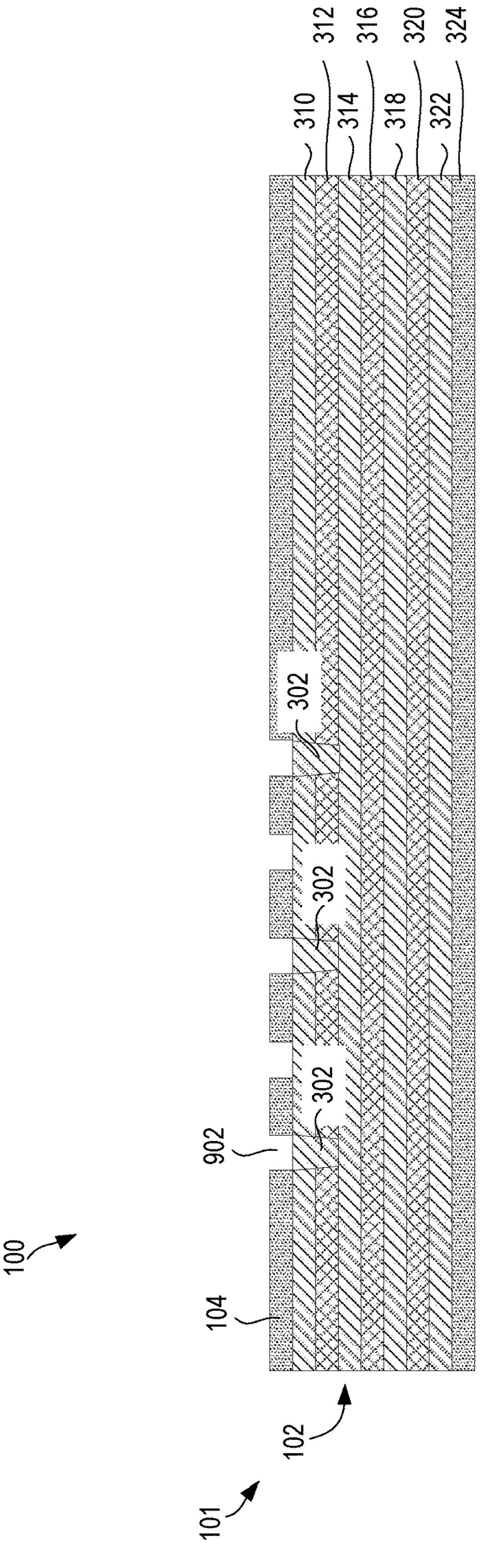
FIG. 9 is a cross-sectional view of one embodiment of a system at one stage of the flowchart of FIG. 6.

In block 606, a solder mask 104 is applied, as shown in FIG. 8. In block 608, holes 902 are exposed in the solder mask 104, as shown in FIG. 9. The holes 902 may be to, e.g., expose pads to connect to components that will be placed on the circuit board 101, expose connections for the conductive shield regions 110, etc.

Figure 10:
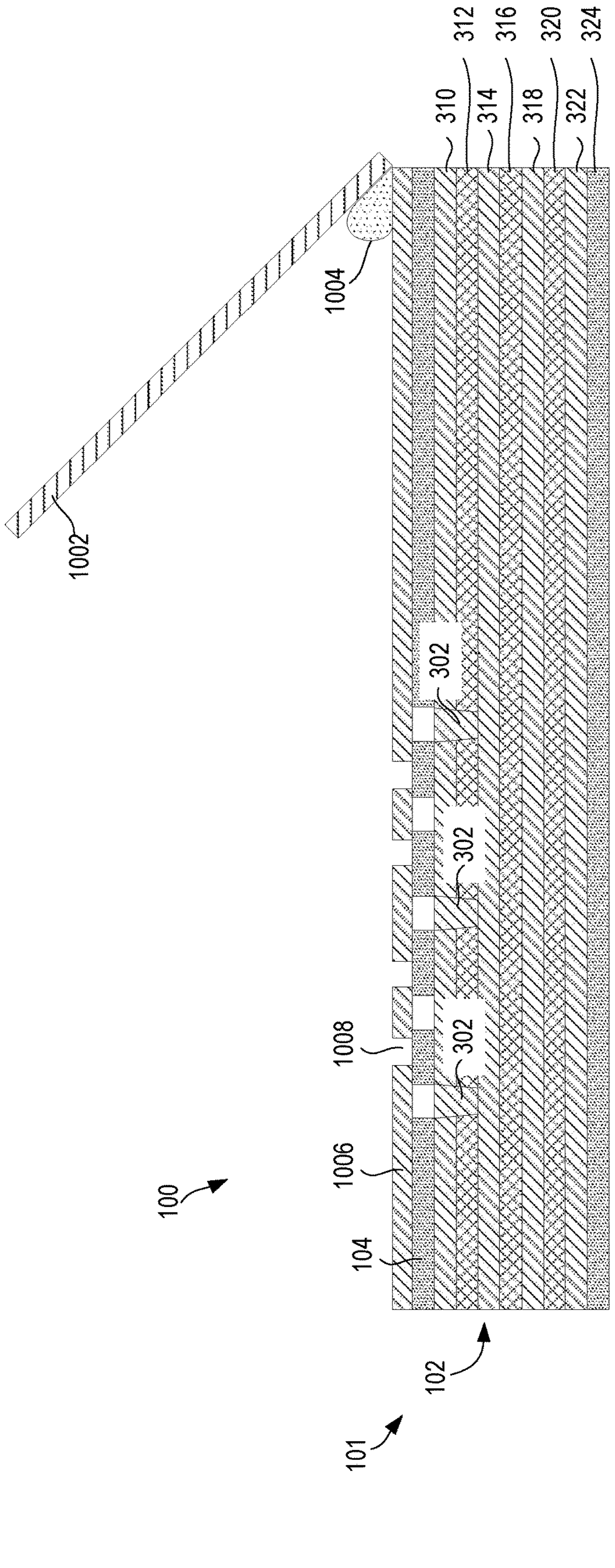
FIG. 10 is a cross-sectional view of one embodiment of a system at one stage of the flowchart of FIG. 6.

In block 610, a nonconductive silk screen layer is deposited, as shown in FIG. 10. A squeegee 1002 is used to apply liquid ink 1004 over a mask 1006 or screen 1006. The mask 1006 defines regions 1008 in which the ink 1004 will be applied. The nonconductive silk screen layer may form the dielectric barriers 112 and/or the legend 118 or other printing 118.

Figure 11:
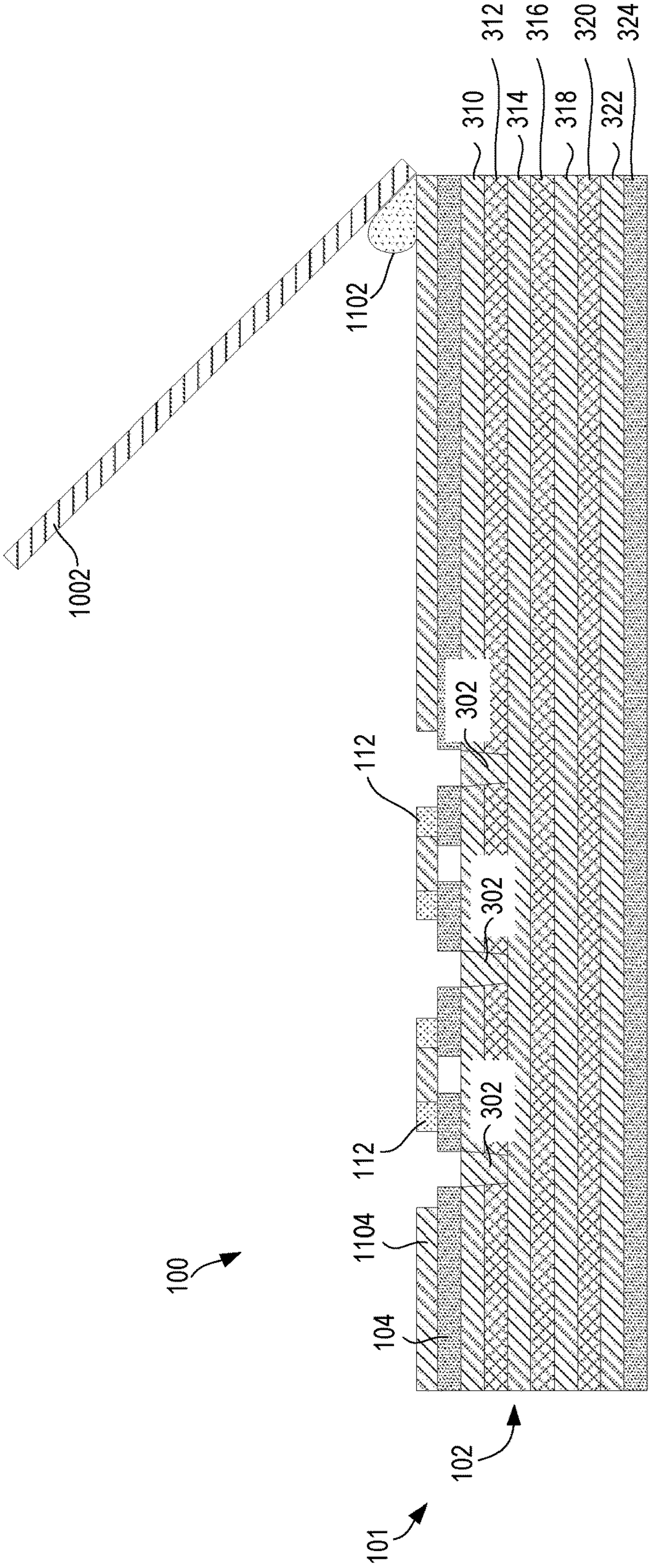
FIG. 11 is a cross-sectional view of one embodiment of a system at one stage of the flowchart of FIG. 6.
Figure 12:
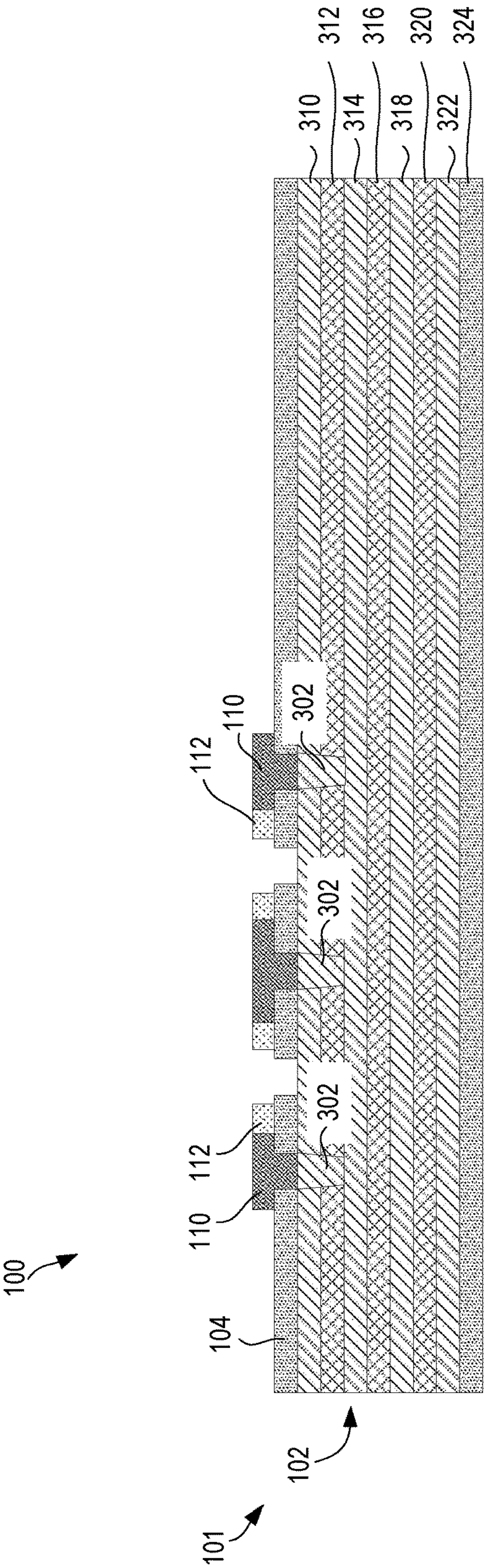
FIG. 12 is a cross-sectional view of one embodiment of a system at one stage of the flowchart of FIG. 6.

In block 612, a conductive silk screen layer is deposited, as shown in FIG. 11, in a similar manner as the nonconductive silk screen layer, using conductive liquid ink 1102. After the conductive silk screen layer is deposited, the conductive regions 110 are present, as shown in FIG. 12. The conductive silk screen layer may include the conductive shield regions 110. The conductive silk screen layer and the nonconductive silk screen layer are both part of the silk screen layer 308. In some embodiments, a single pass at printing the conductive and/or nonconductive ink may not form a thick enough layer as desired. In such embodiments, the screen printing process may be repeated one or more times using the nonconductive 1004 and/or conductive ink 1102, building up the nonconductive and/or conductive silk screen layers. In between the screen printing processes, the nonconductive 1004 and/or conductive ink 1102 may be dried or cured. For example, in one embodiment, the conductive shield regions 110 may be, e.g., 30 micrometers high, and the screen printing process may result in a layer of conductive ink that is 10 micrometers high. In order to form the conductive shield regions 110 at a height of 30 micrometers, the screen printing process may be repeated three times, with drying or curing the ink between each repetition.

Although screen printing is described above, it should be appreciated that other approaches may be used to apply the conductive shield regions 110, dielectric barriers 112, and/or the legend 118. For example, some or all of the conductive shield regions 110, dielectric barriers 112, and/or the legend 118 may be applied using spray painting, machine painting, machine printing, inkjet printing, and/or the like.

Figure 13:
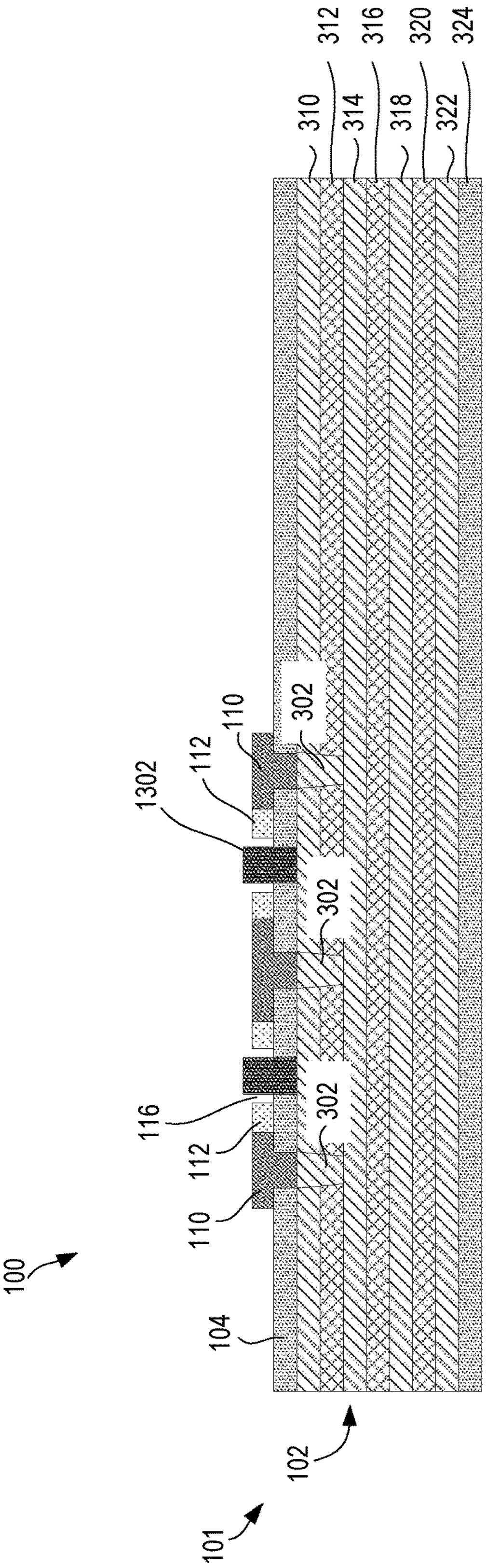
FIG. 13 is a cross-sectional view of one embodiment of a system at one stage of the flowchart of FIG. 6.

In block 614, solder paste 1302 may be applied, as shown in FIG. 13. The solder paste 1302 may be placed on contact pads for components such as the inductors 108. In block 616, components are placed on the circuit board 101, such as the inductors 108 and/or the integrated circuit components 106. In block 618, the solder balls and solder paste 1302 is reflowed to bond the components 108, 106 to the circuit board 101.

It should be appreciated that the use of screen printing conductive shield regions 110 under inductors 108 is merely one possible use case, and other use cases are envisioned as well. In general, conductive shield regions 110 may be placed in a silk screen layer 308 over a solder mask 104 to shield electromagnetic interference (EMI) and/or radiofrequency interference (RFI) to/from components for any suitable purpose. For example, in one embodiment, the circuit board 101 may include one or more power planes, which may be on a top or bottom layer of the substrate 102 (i.e., adjacent the solder mask 104). Without shielding, the power plane may emit RF radiation that can interfere with communication by an antenna of the device (e.g., the device 1400 described below) in, e.g., an LTE band, a 5G band, a Wi-Fi band, or any other band in the range of, e.g., 300-7,000 megahertz. To mitigate the RFI, one or more conductive shield regions 110 may be placed in the silk screen layer 308 over the solder mask 104 in a region above and/or around the power planes. In one test, shielding a power plane with one or more conductive shield regions 110 reduced RFI by up to 20-40 dB, depending on factors such as the thickness of the conductive shield region 110, the frequency, the noise magnitude, etc. In particular, in one test, adding a conductive shield region 110 reduced RFI in an LTE low band (around 650 megahertz) by 23 dB, reduced RFI in a Wi-Fi 5 GHz band (around 5,577 megahertz) by 8 dB, and reduced RFI in a Wi-Fi 6E band (around 6,379 megahertz) by 9 dB. In one test, such a conductive shield region 110 showed no cracks or delamination after five reflow, and no electrical defect caused by the conductive shield region 110 was detected.

Figure 14:
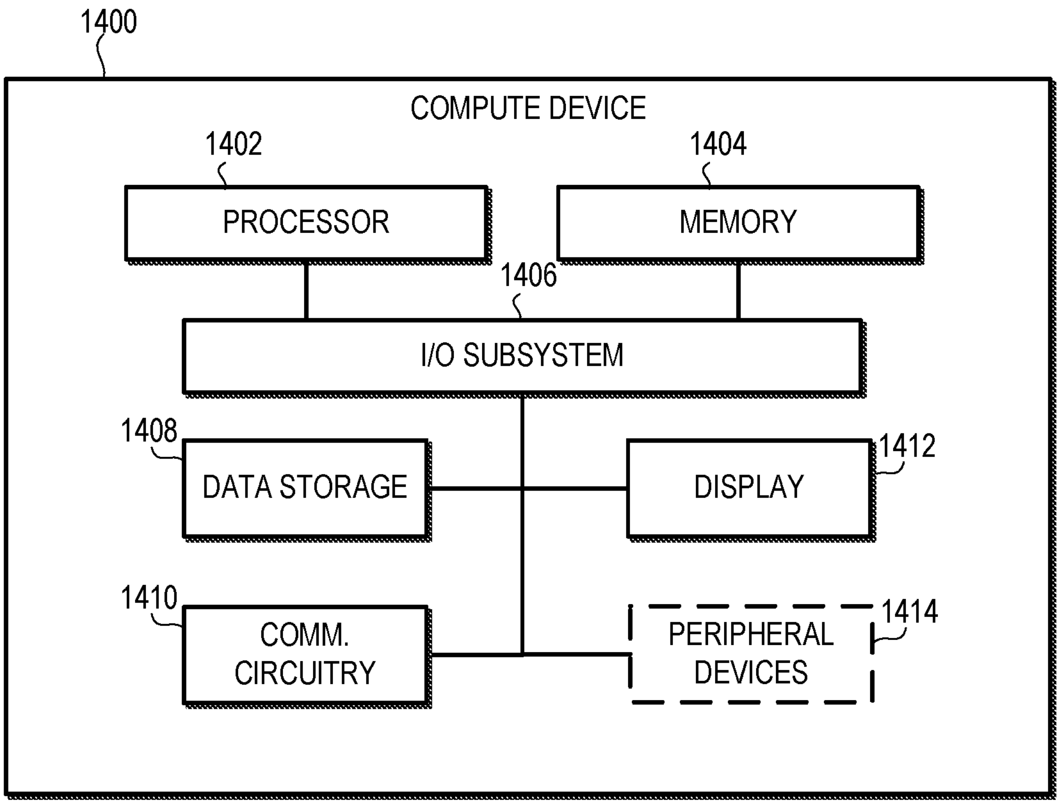
FIG. 14 illustrates an embodiment of a block diagram for a compute system that may include the system of FIG. 1.

Referring now to FIG. 14, in one embodiment, a compute device 1400 is shown. The compute device 1400 may be embodied as any type of compute device. For example, the compute device 1400 may be embodied as or otherwise be included in, without limitation, a server computer, an embedded computing system, a System-on-a-Chip (SoC), a multiprocessor system, a processor-based system, a consumer electronic device, a smartphone, a cellular phone, a desktop computer, a tablet computer, a notebook computer, a laptop computer, a network device, a router, a switch, a networked computer, a wearable computer, a handset, a messaging device, a camera device, and/or any other compute device. In some embodiments, the compute device 1400 may be located in a data center, such as an enterprise data center (e.g., a data center owned and operated by a company and typically located on company premises), managed services data center (e.g., a data center managed by a third party on behalf of a company), a colocated data center (e.g., a data center in which data center infrastructure is provided by the data center host and a company provides and manages their own data center components (servers, etc.)), cloud data center (e.g., a data center operated by a cloud services provider that hosts companies applications and data), and an edge data center (e.g., a data center, typically having a smaller footprint than other data center types, located close to the geographic area that it serves).

The illustrative compute device 1400 includes a processor 1402, a memory 1404, an input/output (I/O) subsystem 1406, data storage 1408, communication circuitry 1410, a display 1412, and one or more peripheral devices 1414. The compute device 1400 may include the system 100, the circuit board 101, etc. For example, a component such as the processor 1402, the memory 1404, the data storage 1408, the communication circuitry 1410, the display 1412, etc., may include or otherwise be embodied as the system 100, the circuit board 101, etc. In some embodiments, one or more of the illustrative components of the compute device 1400 may be incorporated in, or otherwise form a portion of, another component. For example, the memory 1404, or portions thereof, may be incorporated in the processor 1402 in some embodiments. In some embodiments, one or more of the illustrative components may be physically separated from another component.

The processor 1402 may be embodied as any type of processor capable of performing the functions described herein. For example, the processor 1402 may be embodied as a single or multi-core processor(s), a single or multi-socket processor, a digital signal processor, a graphics processor, a neural network compute engine, an image processor, a microcontroller, or other processor or processing/controlling circuit. Similarly, the memory 1404 may be embodied as any type of volatile or non-volatile memory or data storage capable of performing the functions described herein. In operation, the memory 1404 may store various data and software used during operation of the compute device 1400 such as operating systems, applications, programs, libraries, and drivers. The memory 1404 is communicatively coupled to the processor 1402 via the I/O subsystem 1406, which may be embodied as circuitry and/or components to facilitate input/output operations with the processor 1402, the memory 1404, and other components of the compute device 1400. For example, the I/O subsystem 1406 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations. The I/O subsystem 1406 may connect various internal and external components of the compute device 1400 to each other with use of any suitable connector, interconnect, bus, protocol, etc., such as an SoC fabric, PCIe®, USB2, USB3, USB4, NVMe®, Thunderbolt®, and/or the like. In some embodiments, the I/O subsystem 1406 may form a portion of a system-on-a-chip (SoC) and be incorporated, along with the processor 1402, the memory 1404, and other components of the compute device 1400 on a single integrated circuit chip.

The data storage 1408 may be embodied as any type of device or devices configured for the short-term or long-term storage of data. For example, the data storage 1408 may include any one or more memory devices and circuits, memory cards, hard disk drives, solid-state drives, or other data storage devices.

The communication circuit 1410 may be embodied as any type of interface capable of interfacing the compute device 1400 with other compute devices, such as over one or more wired or wireless connections. In some embodiments, the communication circuit 1410 may be capable of interfacing with any appropriate cable type, such as an electrical cable or an optical cable. The communication circuit 1410 may be configured to use any one or more communication technology and associated protocols (e.g., Ethernet, Bluetooth®, Wi-Fi®, WiMAX, near field communication (NFC), etc.). The communication circuit 1410 may be located on silicon separate from the processor 1402, or the communication circuit 1410 may be included in a multi-chip package with the processor 1402, or even on the same die as the processor 1402. The communication circuit 1410 may be embodied as one or more add-in-boards, daughtercards, network interface cards, controller chips, chipsets, specialized components such as a field-programmable gate array (FPGA) or application-specific integrated circuit (ASIC), or other devices that may be used by the compute device 1400 to connect with another compute device. In some embodiments, communication circuit 1410 may be embodied as part of a system-on-a-chip (SoC) that includes one or more processors or included on a multichip package that also contains one or more processors. In some embodiments, the communication circuit 1410 may include a local processor (not shown) and/or a local memory (not shown) that are both local to the communication circuit 1410. In such embodiments, the local processor of the communication circuit 1410 may be capable of performing one or more of the functions of the processor 1402 described herein. Additionally or alternatively, in such embodiments, the local memory of the communication circuit 1410 may be integrated into one or more components of the compute device 1400 at the board level, socket level, chip level, and/or other levels.

The display 1412 may be embodied as any type of display on which information may be displayed to a user of the compute device 1400, such as a touchscreen display, a liquid crystal display (LCD), a thin film transistor LCD (TFT-LCD), a light-emitting diode (LED) display, an organic light-emitting diode (OLED) display, a cathode ray tube (CRT) display, a plasma display, an image projector (e.g., 2D or 3D), a laser projector, a heads-up display, and/or other display technology. The display 1412 may have any suitable resolution, such as 7680×4320, 3840×2160, 1920×1200, 1920×1080, etc.

In some embodiments, the compute device 1400 may include other or additional components, such as those commonly found in a compute device. For example, the compute device 1400 may also have peripheral devices 1414, such as a keyboard, a mouse, a speaker, an external storage device, etc. In some embodiments, the compute device 1400 may be connected to a dock that can interface with various devices, including peripheral devices 1414.

EXAMPLES

Illustrative examples of the technologies disclosed herein are provided below. An embodiment of the technologies may include any one or more, and any combination of, the examples described below.

Example 1 includes a circuit board comprising a substrate comprising one or more layers; a solder mask, wherein a bottom surface of the solder mask is adjacent a top surface of the substrate; and one or more conductive regions adjacent a top surface of the solder mask.

Example 2 includes a system comprising the circuit board of Example 1, further comprising an inductor disposed on the circuit board, wherein at least one of the one or more conductive regions is between the inductor and the circuit board.

Example 3 includes the subject matter of Example 2, and wherein the at least one of the one or more conductive regions surrounds one or more contact pads of the circuit board, wherein the inductor is disposed on the one or more contact pads.

Example 4 includes the subject matter of any of Examples 2 and 3, and further including one or more dielectric regions adjacent the top surface of the solder mask, wherein the one or more dielectric regions are between the one or more conductive regions and the one or more contact pads.

Example 5 includes the subject matter of any of Examples 2-4, and further including a power plane on a top layer of the substrate nearest the solder mask.

Example 6 includes the subject matter of any of Examples 2-5, and wherein the one or more conductive regions reduce radiofrequency interference from the power plane at an antenna by at least about 5 dB.

Example 7 includes the subject matter of any of Examples 2-6, and wherein the one or more conductive regions reduce radiofrequency interference from the power plane at an antenna by at least about 20 dB.

Example 8 includes the subject matter of any of Examples 2-7, and further including one or more vias, wherein the one or more vias electrically couple the one or more conductive regions to a ground plane below the top surface of the substrate.

Example 9 includes the subject matter of any of Examples 2-8, and wherein the one or more conductive regions comprise conductive ink.

Example 10 includes the subject matter of any of Examples 2-9, and wherein a height of the one or more conductive regions is between about 10 and about 50 micrometers.

Example 11 includes the subject matter of any of Examples 2-10, and wherein the one or more conductive regions comprise a contact resistance of less than about 2 milliohm-centimeter squared.

Example 12 includes the subject matter of any of Examples 2-11, and wherein the one or more conductive regions comprise a sheet resistance of less than about 5 milliohm per square for a thickness of about 25 micrometers.

Example 13 includes the subject matter of any of Examples 2-12, and wherein an inductor is disposed on the circuit board above one of the one or more conductive regions, wherein, in use, the one or more conductive regions reduce voltage noise on a trace of the circuit board below the inductor by at least about 25%.

Example 14 includes a processor comprising the circuit board of Example 1.

Example 15 includes a circuit board comprising a substrate comprising one or more layers; a solder mask adjacent the substrate; and a silk screen layer adjacent the solder mask, wherein the silk screen layer comprises one or more conductive regions.

Example 16 includes the subject matter of Example 15, and wherein the silk screen layer further comprises one or more text labels, the one or more text labels comprising one or more nonconductive regions.

Example 17 includes a system comprising the circuit board of Example 15, further comprising an inductor disposed on the circuit board, wherein at least one of the one or more conductive regions is between the inductor and the circuit board.

Example 18 includes the subject matter of Example 17, and wherein the at least one of the one or more conductive regions surrounds one or more contact pads of the circuit board, wherein the inductor is disposed on the one or more contact pads.

Example 19 includes the subject matter of any of Examples 17 and 18, and further including one or more dielectric regions adjacent the solder mask, wherein the one or more dielectric regions are between the one or more conductive regions and the one or more contact pads.

Example 20 includes the subject matter of any of Examples 17-19, and further including a power plane on a top layer of the substrate nearest the solder mask.

Example 21 includes the subject matter of any of Examples 17-20, and wherein the one or more conductive regions reduce radiofrequency interference from the power plane at an antenna by at least about 5 dB.

Example 22 includes the subject matter of any of Examples 17-21, and wherein the one or more conductive regions reduce radiofrequency interference from the power plane at an antenna by at least about 20 dB.

Example 23 includes the subject matter of any of Examples 17-22, and further including one or more vias, wherein the one or more vias electrically couple the one or more conductive regions to a ground plane of the substrate.

Example 24 includes the subject matter of any of Examples 17-23, and wherein the one or more conductive regions comprise conductive ink.

Example 25 includes the subject matter of any of Examples 17-24, and wherein a height of the one or more conductive regions is between about 10 and about 50 micrometers.

Example 26 includes the subject matter of any of Examples 17-25, and wherein the one or more conductive regions comprise a contact resistance of less than about 2 milliohm-centimeter squared.

Example 27 includes the subject matter of any of Examples 17-26, and wherein the one or more conductive regions comprise a sheet resistance of less than about 5 milliohm per square for a thickness of about 25 micrometers.

Example 28 includes the subject matter of any of Examples 17-27, and wherein an inductor is disposed on the circuit board above one of the one or more conductive regions, wherein, in use, the one or more conductive regions reduce voltage noise on a trace of the circuit board below the inductor by at least about 25%.

Example 29 includes a processor comprising the circuit board of Example 15.

Example 30 includes a circuit board comprising a substrate comprising one or more layers; a solder mask layer, wherein a bottom surface of the solder mask layer is adjacent a top surface of the substrate; and means for shielding the one or more layers, wherein the means for shielding the one or more layers is adjacent a top surface of the solder mask layer.

Example 31 includes a system comprising the circuit board of Example 30, further comprising an inductor disposed on the circuit board, wherein the means for shielding the one or more layers is between the inductor and the circuit board.

Example 32 includes the subject matter of Example 31, and wherein means for shielding the one or more layers surrounds one or more contact pads of the circuit board, wherein the inductor is disposed on the one or more contact pads.

Example 33 includes the subject matter of any of Examples 31 and 32, and further including one or more dielectric regions adjacent the top surface of the solder mask, wherein the one or more dielectric regions are between the means for shielding the one or more layers and the one or more contact pads.

Example 34 includes the subject matter of any of Examples 31-33, and further including a power plane on a top layer of the substrate nearest the solder mask.

Example 35 includes the subject matter of any of Examples 31-34, and wherein the means for shielding reduce radiofrequency interference from the power plane at an antenna by at least about 5 dB.

Example 36 includes the subject matter of any of Examples 31-35, and wherein the means for shielding reduce radiofrequency interference from the power plane at an antenna by at least about 20 dB.

Example 37 includes the subject matter of any of Examples 31-36, and further including one or more vias, wherein the one or more vias electrically couple the means for shielding the one or more layers to a ground plane below the top surface of the substrate.

Example 38 includes the subject matter of any of Examples 31-37, and wherein the means for shielding the one or more layers comprise conductive ink.

Example 39 includes the subject matter of any of Examples 31-38, and wherein a height of the means for shielding the one or more layers is between about 10 and about 50 micrometers.

Example 40 includes the subject matter of any of Examples 31-39, and wherein the means for shielding the one or more layers comprise a contact resistance of less than about 2 milliohm-centimeter squared.

Example 41 includes the subject matter of any of Examples 31-40, and wherein the means for shielding the one or more layers comprise a sheet resistance of less than about 5 milliohm per square for a thickness of about 25 micrometers.

Example 42 includes the subject matter of any of Examples 31-41, and wherein an inductor is disposed on the circuit board above the means for shielding the one or more layers, wherein, in use, the means for shielding the one or more layers reduce voltage noise on a trace of the circuit board below the inductor by at least about 25%.

Example 43 includes a processor comprising the circuit board of Example 30.

The invention claimed is:

1. A system comprising:

a circuit board comprising:

a substrate comprising one or more layers;

a solder mask, wherein a bottom surface of the solder mask is adjacent a top surface of the substrate; and one or more conductive regions adjacent a top surface of the solder mask; and an inductor mounted on the circuit board, wherein at least one of the one or more conductive regions is between the inductor and the circuit board.

2. The system of claim 1, wherein the at least one of the one or more conductive regions surrounds one or more contact pads of the circuit board, wherein the inductor is mounted on the one or more contact pads.

3. The system of claim 2, further comprising one or more dielectric regions adjacent the top surface of the solder mask, wherein the one or more dielectric regions are between the one or more conductive regions and the one or more contact pads.

4. The system of claim 1, further comprising a power plane on a top layer of the substrate nearest the solder mask.

5. The system of claim 4, wherein the one or more conductive regions reduce radiofrequency interference from the power plane at an antenna by at least 5 dB.

6. The system of claim 1, further comprising one or more vias, wherein the one or more vias electrically couple the one or more conductive regions to a ground plane below the top surface of the substrate.

7. The system of claim 1, wherein the one or more conductive regions comprise conductive ink.

8. The system of claim 1, wherein a height of the one or more conductive regions is between about 10 and about 50 micrometers.

9. The system of claim 1, wherein the one or more conductive regions comprise a contact resistance of less than about 2 milliohm-centimeter squared.

10. The system of claim 1, wherein the one or more conductive regions comprise a sheet resistance of less than about 5 milliohm per square for a thickness of about 25 micrometers.

11. The system of claim 1, wherein an inductor is mounted on the circuit board above one of the one or more conductive regions, wherein, in use, the one or more conductive regions reduce voltage noise on a trace of the circuit board below the inductor by at least about 25%.

12. The system of claim 1, further comprising a processor, the processor comprising the circuit board.

13. The system of claim 1, further comprising a silk screen layer adjacent the solder mask, wherein the silk screen layer comprises the one or more conductive regions, and wherein the silk screen layer further comprises one or more text labels, the one or more text labels comprising one or more nonconductive regions.

14. A circuit board comprising:

a substrate comprising one or more layers;

a solder mask adjacent the substrate; and a silk screen layer adjacent the solder mask, wherein the silk screen layer comprises one or more conductive regions, wherein the silk screen layer further comprises one or more text labels, the one or more text labels comprising one or more nonconductive regions.

15. A system comprising the circuit board of claim 14, further comprising an inductor disposed on the circuit board, wherein at least one of the one or more conductive regions is between the inductor and the circuit board.

16. The circuit board of claim 14, further comprising a power plane on a top layer of the substrate nearest the solder mask.

17. The circuit board of claim 14, further comprising one or more vias, wherein the one or more vias connect the one or more conductive regions to a ground plane of the substrate.

18. A system comprising:

a circuit board comprising:

a substrate comprising one or more layers;

a solder mask layer, wherein a bottom surface of the solder mask layer is adjacent a top surface of the substrate; and means for shielding the one or more layers, wherein the means for shielding the one or more layers is adjacent a top surface of the solder mask layer; and an inductor mounted on the circuit board, wherein the means for shielding the one or more layers is between the inductor and the circuit board.

19. The system of claim 18, wherein, in use, the means for shielding reduces voltage noise on a trace of the circuit board below the inductor by at least about 25 percent.

20. The system of claim 18, wherein the means for shielding comprises a silk screen layer adjacent the solder mask layer, the silk screen layer comprising one or more conductive regions, and wherein the silk screen layer further comprises one or more text labels, the one or more text labels comprising one or more nonconductive regions.

* * * * *